United States Patent
Chan

(10) Patent No.: US 9,306,502 B2
(45) Date of Patent: Apr. 5, 2016

(54) SYSTEM PROVIDING SWITCHABLE IMPEDANCE TRANSFORMER MATCHING FOR POWER AMPLIFIERS

(75) Inventor: Ngar Loong Alan Chan, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 203 days.

(21) Appl. No.: 13/103,928

(22) Filed: May 9, 2011

(65) Prior Publication Data

US 2012/0286875 A1 Nov. 15, 2012

(51) Int. Cl.
*H03F 1/02* (2006.01)
*H03F 3/189* (2006.01)

(52) U.S. Cl.
CPC ............ *H03F 1/0277* (2013.01); *H03F 3/189* (2013.01)

(58) Field of Classification Search
USPC ............ 455/41.1–41.3, 123, 129, 193.1, 80, 455/11.1; 330/51, 124 R, 295, 195, 276, 302
See application file for complete search history.

(56) References Cited

U.S. PATENT DOCUMENTS

| | | | |
|---|---|---|---|
| 4,490,684 A | 12/1984 | Epsom et al. | |
| 5,287,069 A | 2/1994 | Okubo et al. | |
| 5,375,257 A | 12/1994 | Lampen | |
| 5,822,429 A | 10/1998 | Casabona et al. | |
| 6,384,679 B1 * | 5/2002 | Lorenz | 330/51 |
| 6,700,440 B2 | 3/2004 | Hareyama | |
| 6,750,707 B2 | 6/2004 | Takei et al. | |
| 6,794,935 B2 | 9/2004 | Klomsdorf et al. | |
| 6,853,245 B2 | 2/2005 | Kim et al. | |
| 7,157,965 B1 | 1/2007 | Kim | |
| 7,183,843 B1 | 2/2007 | Jones et al. | |
| 7,202,736 B1 | 4/2007 | Dow et al. | |
| 7,262,656 B2 | 8/2007 | Shiikuma | |
| 7,295,064 B2 | 11/2007 | Shiikuma et al. | |

(Continued)

FOREIGN PATENT DOCUMENTS

| | | |
|---|---|---|
| CN | 1407829 A | 4/2003 |
| EP | 2234271 A2 | 9/2010 |

(Continued)

OTHER PUBLICATIONS

Adabi, "A mm-Wave transformer based TR switch in 90nm CMOS technology", Proceedings of the 39th European Microwave Conference, Sep. 2009, 4 pgs.

(Continued)

*Primary Examiner* — Sonny Trinh
*Assistant Examiner* — Cindy Trandai
(74) *Attorney, Agent, or Firm* — Liberty E. Mann

(57) ABSTRACT

System providing switchable impedance transformer matching for power amplifiers. In an exemplary implementation, an amplifier providing switchable impedance matching includes an output inductor (L1) that is part of an output path of the amplifier and a first amplifier stage comprising a first inductor (L4) coupled to the output inductor, the first inductor configured to couple a signal amplified by the first amplifier stage at a first power level to the output inductor in response to a first enable signal. The amplifier also includes a second amplifier stage comprising a second inductor (L5) coupled to the output inductor, the second inductor configured to couple the signal amplified by the second amplifier stage at a second power level to the output inductor in response to a second enable signal.

38 Claims, 13 Drawing Sheets

(56) References Cited

U.S. PATENT DOCUMENTS

| | | | |
|---|---|---|---|
| 7,295,065 B2 | 11/2007 | Shah et al. | |
| 7,609,115 B2 | 10/2009 | Whelan et al. | |
| 7,609,116 B2 | 10/2009 | Gerhard et al. | |
| 7,646,248 B2 | 1/2010 | Yang et al. | |
| 7,663,435 B2 | 2/2010 | Kim et al. | |
| 7,863,976 B1 | 1/2011 | Loeb et al. | |
| 7,884,668 B2 | 2/2011 | Blednov | |
| 8,103,221 B2 | 1/2012 | Ta et al. | |
| 8,245,179 B2 | 8/2012 | Inoue | |
| 8,374,279 B2 | 2/2013 | Adler et al. | |
| 2003/0025555 A1* | 2/2003 | Ohnishi et al. | 330/124 R |
| 2003/0076167 A1 | 4/2003 | Hellberg | |
| 2003/0090287 A1* | 5/2003 | Zivanovic | 324/765 |
| 2005/0030107 A1* | 2/2005 | Shimizu et al. | 330/307 |
| 2005/0099222 A1 | 5/2005 | Yang et al. | |
| 2005/0134377 A1 | 6/2005 | Dent | |
| 2006/0057981 A1* | 3/2006 | Tsuda | 455/127.2 |
| 2006/0087385 A1 | 4/2006 | Fitzpatrick et al. | |
| 2006/0105733 A1 | 5/2006 | Singh et al. | |
| 2006/0232355 A1 | 10/2006 | Park et al. | |
| 2007/0013575 A1 | 1/2007 | Lee et al. | |
| 2007/0080750 A1* | 4/2007 | Liebenrood | 330/252 |
| 2007/0149146 A1* | 6/2007 | Hwang et al. | 455/80 |
| 2008/0117894 A1* | 5/2008 | McMorrow | 370/359 |
| 2008/0132180 A1 | 6/2008 | Manicone | |
| 2008/0207256 A1 | 8/2008 | Chan | |
| 2009/0190509 A1 | 7/2009 | Yoon | |
| 2009/0219908 A1 | 9/2009 | Rofougaran | |
| 2010/0001802 A1 | 1/2010 | Blednov | |
| 2010/0127780 A1* | 5/2010 | An et al. | 330/295 |
| 2010/0188146 A1* | 7/2010 | Chung et al. | 330/124 R |
| 2010/0188147 A1 | 7/2010 | Blednov et al. | |
| 2010/0225400 A1 | 9/2010 | Rofougaran et al. | |
| 2010/0295629 A1 | 11/2010 | Klemens et al. | |
| 2011/0026442 A1 | 2/2011 | Yoon | |
| 2011/0032854 A1 | 2/2011 | Carney et al. | |
| 2011/0122932 A1 | 5/2011 | Lovberg et al. | |
| 2011/0140786 A1 | 6/2011 | Blednov | |
| 2011/0169590 A1 | 7/2011 | Namerikawa et al. | |
| 2011/0279184 A1 | 11/2011 | Chan et al. | |
| 2012/0062334 A1 | 3/2012 | Yehezkely | |
| 2012/0105147 A1 | 5/2012 | Harris et al. | |
| 2012/0184233 A1 | 7/2012 | Jones et al. | |
| 2013/0241640 A1 | 9/2013 | Lin et al. | |
| 2013/0321097 A1 | 12/2013 | Khlat et al. | |
| 2014/0170995 A1 | 6/2014 | Lin | |

FOREIGN PATENT DOCUMENTS

| | | |
|---|---|---|
| JP | H08330930 A | 12/1996 |
| JP | H1093470 A | 4/1998 |
| JP | 2003046340 A | 2/2003 |
| JP | 2004048271 A | 2/2004 |
| JP | 2006295896 A | 10/2006 |
| JP | 2009303040 A | 12/2009 |
| KR | 20060108863 A | 10/2006 |
| WO | 2006066461 A1 | 6/2006 |
| WO | 2011045312 A1 | 4/2011 |

OTHER PUBLICATIONS

Cohen, et al., "A bidirectional TX/RX four element phased-array at 60GHz with RF-IF conversion block in 90nm CMOS process", 2009 IEEE Radio Frequency Integrated Circuits Symposium, RFIC 2009, pp. 207-210.

Cohen, et al., "A CMOS bidirectional 32-element phased-array transceiver at 60GHz with LTCC antenna", 2012 IEEE Radio Frequency Integrated Circuits Symposium (RFIC), pp. 439-442.

International Search Report and Written Opinion—PCT/US2012/037102—ISA/EPO—Jan. 8, 2013.

Jeon, et al., "A Triple-Mode Balanced Linear CMOS Power Amplifier Using a Switched-Quadrature Coupler", IEEE Journal of Solid-State Circuits, Sep. 2012, vol. 47, No. 9, pp. 2019-2032.

Kim, et al., "A Switchless Q-Band Bidirectional Transceiver in 0.12um SiGe BiCMOS Technology", IEEE Journal of Solid-State Circuits, Feb. 2012, vol. 47, No. 2, pp. 368-380.

Kim, et al., "Optimum operation of asymmetrical-cells-based linear Doherty power Amplifiers—uneven power drive and power matching", IEEE Transactions on Microwave Theory and Techniques, May 2005, vol. 53, Issue 5, 8 pages.

Razavi, et al., "A UWB CMOS transceiver," IEEE Journal of Solid-State Circuits, Dec. 2005, vol. 40, No. 12, pp. 2555-2562.

* cited by examiner

SYSTEM PROVIDING SWITCHABLE IMPEDANCE TRANSFORMER MATCHING FOR POWER AMPLIFIERS

BACKGROUND

1. Field

The present application relates generally to the operation and design of amplifiers, and more particularly, to a system providing switchable impedance transformer matching for amplifiers, for example, power amplifiers.

2. Background

Efficient signal amplification is especially important during transmissions from portable devices. Typically, such devices comprise a power amplifier having its output power determined by an optimum impedance on the load line provided by either lumped circuit matching or a transformer that couples the amplifier output to an output transmission path. This configuration results in good efficiency at high output power levels but not at low output power levels.

To illustrate this problem, consider a portable mobile station transmitting data to a base station in a cellular communication system. When the base station is far away, the mobile station increases its transmission power to assure proper communication with the base station. At high output power levels the mobile station's amplifier is operating very efficiently based on the single fixed impedance that couples the amplifier output to the output transmission path. However, as the mobile stations moves closer to the base station, the mobile station may reduce its transmit power. At lower output power levels, the mobile station's amplifier operates less efficiently because the single fixed impedance that couples the amplifier output to the output transmission path provides less efficiency at lower power levels. This reduced efficiency means increased power consumption, which can be very problematic for battery operated portable devices.

Portable devices having multiple communication interfaces present additional problems with respect to signal amplification. For example, a portable device having both wireless LAN (WLAN) and Bluetooth (BT) communication interfaces typically utilizes a separate amplifier for each interface. Not only does this require additional circuitry, but coupling multiple amplifiers into the transmission path may require special switches or other circuitry that may introduce signal loss.

Therefore, it would be desirable to have an amplifier that provides efficient operation at both low and high power levels, and which can be configured to provide amplification for multiple communication interfaces thereby conserving power, circuitry, and maintaining signal quality.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

A novel switchable impedance transformer matching system is provided that operates to significantly increase efficiency and reduce power consumption of an amplifier operating at low output power levels. The amplifier comprises two or more amplification stages that are inductively coupled to an output path. A first amplification stage is used for high power amplification and a second amplification stage is used for low power amplification. The amplification stages are selectively and inductively coupled to the output path thereby providing switchable impedance transformer matching to adjust their output impedances such that the low power amplification stage provides reduced power consumption (and greater efficiency) at low output power levels when compared to the high power amplification stage operating at the same power level. Thus, by providing two or more amplification stages each inductively coupled to the output path with appropriately matched output impedances, the amplifier can be configured to provide reduce power consumption and high efficiency at low output power levels.

Thus, implementations of the switchable impedance transformer matching system provide one or more of the following features.
1. Insignificant performance degradation on the receive path by using a switch or concurrent matching
2. Expandable to allow for any desired number of amplification stages to extend efficiency improvements to very low output power levels
3. Shared circuitry reduces circuit footprint
4. Provides multiple power stages for use by multiple communication interfaces or standards available on a device.

Figure 1:
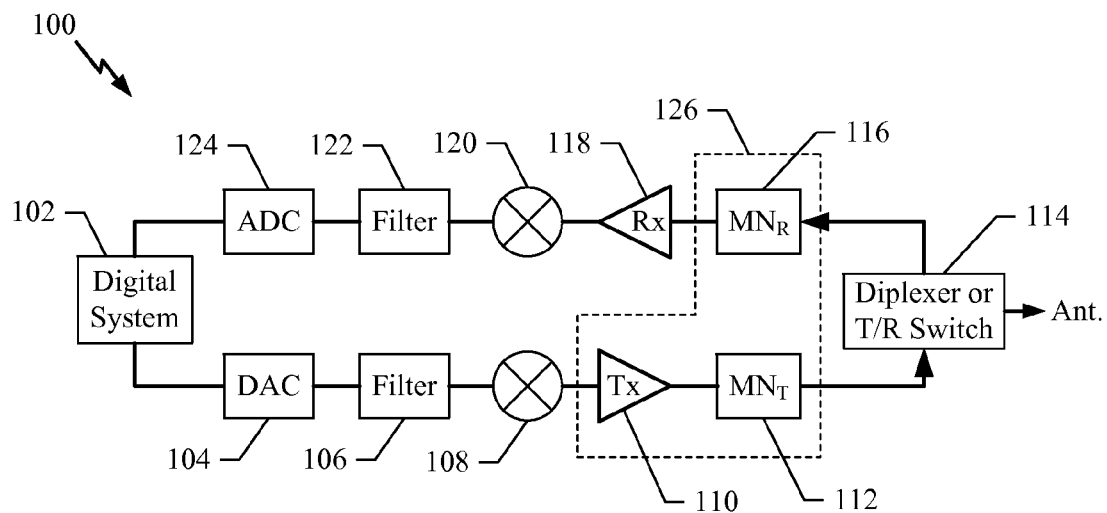
FIG. 1 shows a conventional transceiver.

FIG. 1 shows a conventional transceiver 100. The transceiver 100 operates to allow a device to transmit and receive signals in a communication network. The transceiver 100 comprises a digital system 102 that receives data from the communication system and generates data for transmission.

During transmit operations, the digital system 102 generates digital data for transmission and passes this data to a digital to analog convertor (DAC) 104. The DAC 104 converts the digital data to an analog signal that is filtered by the filter 106 and input to mixer 108. The mixer 108 generates a transmit signal at the appropriate transmission frequency that is input to a transmit amplifier 110.

The transmit amplifier 110 amplifies the transmit signal to a selected power level based on an impedance provided by a transmit matching network 112. The matching network 112 matches the impedance provided to the transmitter 110 to an impedance that is provided to a diplexer and/or transmit/receive (T/R) switch 114 that couples the amplified transmit signal to an antenna for transmission.

During receive operations, signals received by the antenna pass through the diplexer and/or T/R switch 114 to a receive matching network 116. The receive matching network 116 matches the impedance provided to the diplexer or transmit/receive (T/R) switch 114 to an impedance provided to a receive amplifier 118.

The receive amplifier 118 amplifies the received signal and inputs the amplified receive signal to a mixer 120 that converts the received signal to baseband. The received baseband signal is then filtered by the filter 122 and input to an analog to digital converter (ADC) 124 that converts the signal to a digital representation that is input to the digital system for processing.

Therefore, the transceiver 100 is configured to allow a device to transmit and receive data in a communication network. It is desirable, especially for portable devices, that the transmit amplifier 110 operates efficiently at a variety of output power levels to conserve power. It is also desirable that the matching networks 112 and 116 provide concurrent matching to facilitate efficiency, reduce circuit requirements, and associated costs. Thus, it is desirable to provide improvements to the amplifier and matching network circuitry indicated at 126. In various aspects, the novel switchable impedance transformer matching system described herein provides these and other improvements.

Figure 2:
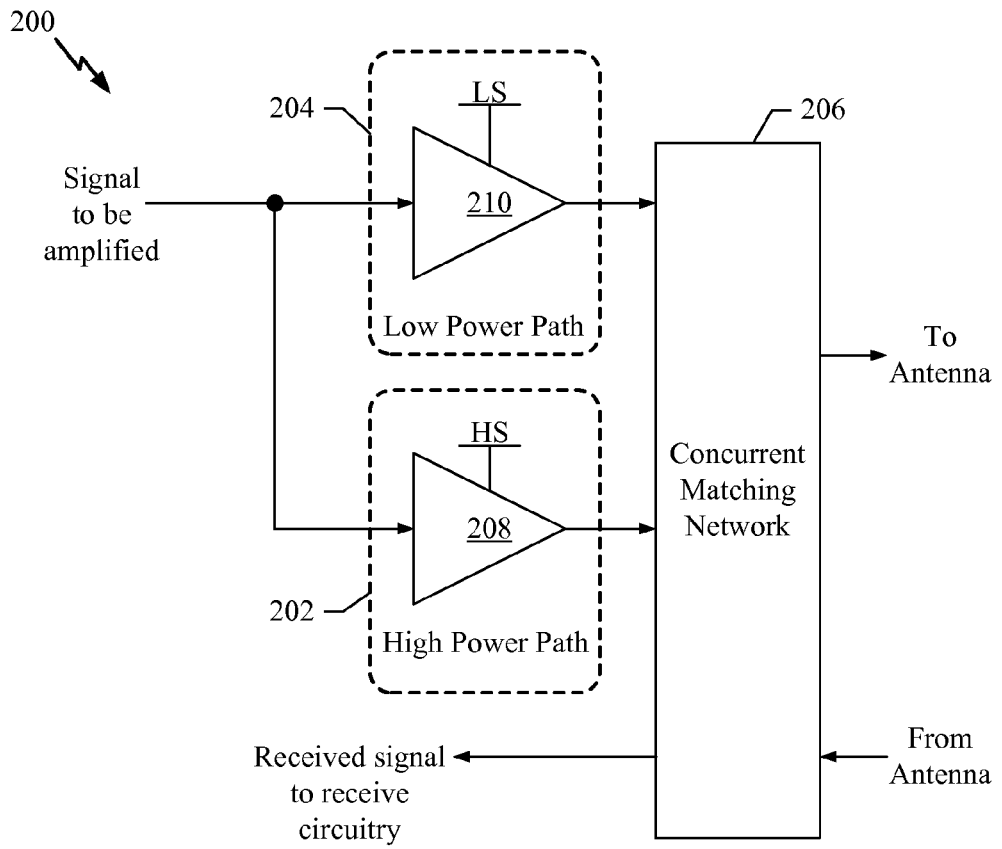
FIG. 2 shows an exemplary a system providing efficient power amplification and switchable impedance transformer matching.

FIG. 2 shows an exemplary a system 200 providing efficient power amplification and switchable impedance transformer matching. The system 200 is suitable for use in a variety of communication devices. For example, the system 200 is suitable for use as the amplifier and matching network indicated at 126 shown in FIG. 1. The system 200 comprises a high power amplification path 202, a low power amplification path 204, and a concurrent matching network 206.

During operation, a signal to be amplified is input to both the high power amplification path 202 and the low power amplification path 204. One of the amplification paths is enabled to produce an amplified signal that is coupled to the concurrent matching network 206. For example, the high power amplification path 202 comprises amplifier 208 that is coupled to a high power supply (HS) to produce a high power output that is coupled to the concurrent matching network 206. The low power amplification path 204 comprises amplifier 210 that is coupled to a low power supply (LS) to produce a low power output that is coupled to the concurrent matching network 206.

Depending on which amplification path is enabled, the concurrent matching network operates to transform the load impedance to an optimum impedance that appears at the power amplifier output. This results in efficient signal amplification at both low and high power levels. The amplified signal is then passed to an antenna for transmission. During signal reception, the concurrent matching network 206 operates to provide impedance matching with receiver electronics to enable a received signal to be passed to receive circuitry for further processing.

Thus, the system 200 operates to allow the output power range to be divided into high and low amplification ranges that operate with improve efficiency over conventional amplifiers that provide high efficiency only at high output power. Furthermore, the system 200 is shown with two power paths but may be expanded to include more power paths as desired. As a result, the system provides a degree of expandability not provided by conventional amplifiers. Additionally, the amplifier stages can be used by multiple communication interfaces or standards available on a device, thereby reducing overall hardware requirements and eliminating special switches or other circuitry that may produce signal loss. More detailed descriptions of implementations and operations of the system 200 are provided below.

Figure 3:
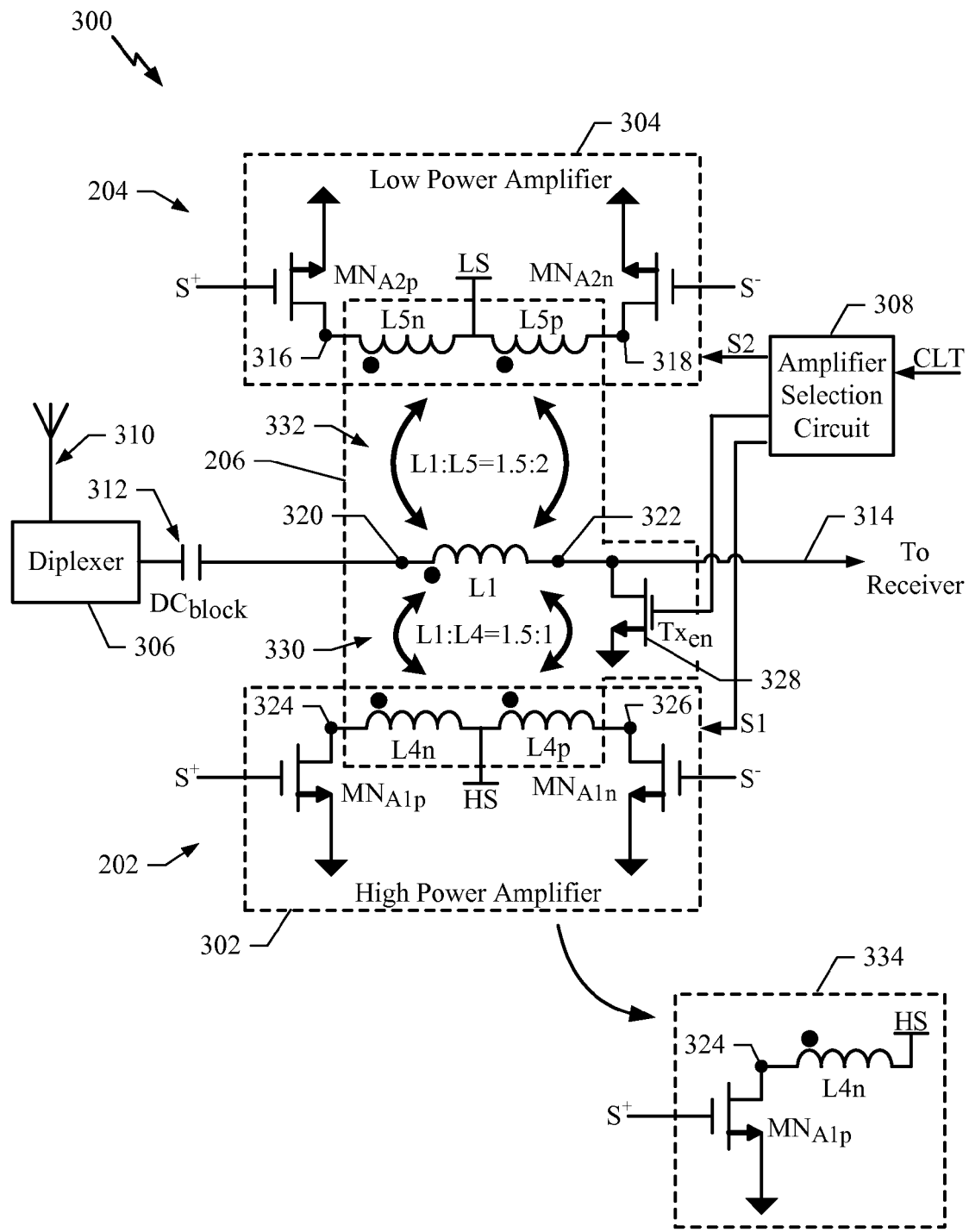
FIG. 3 shows an exemplary amplifier providing switchable impedance transformer matching in accordance with the system shown in FIG. 2.

FIG. 3 shows an exemplary power amplifier 300 providing switchable impedance transformer matching in accordance with the system 200 shown in FIG. 2. The amplifier 300 comprises a first amplifier 302, a second amplifier 304, a diplexer 306, and an amplifier selection circuit 308. For example, the first amplifier 302 is part of the high power amplification path 202 and the second amplifier 304 is part of the low power amplification path 204.

During the receive operation, signals received at antenna 310 are passed to diplexer 306. The diplexer 306 comprises any suitable diplexer configured to allow signals to be received and transmitted from the antenna 310. The received signals then flow from the diplexer 306 to DC blocking capacitor 312 where DC components of the signal are removed. From the capacitor 312 the received signals flow through inductor L1 and then on path 314 to receiver circuitry, not shown.

During the transmit operation, the amplifier selection circuit 308 determines which of the first 302 and second 304 amplifiers will be used to amplify a signal for transmission. For example, the amplifier selection circuit 308 outputs a first selection signal (S1) to enable the first amplifier 302, and outputs a second selection signal (S2) to enable the second amplifier 304. Additionally, the transistor 328 is enabled using a $Tx_{en}$ signal, which effectively couples terminal 322 to ground to enable transmission and disable the receiver path 314.

Assuming the first amplifier 302 is enabled, a differential signal (S+, S−) is received at the gate terminals of transistors $MN_{A1p}$ and $MN_{A1n}$, respectively. The transistors $MN_{A1p}$ and $MN_{A1n}$ are coupled to coil L4, which in turn is coupled to a high voltage power supply (HS). For example, in an exemplary implementation, the high voltage power supply is set to 2.9 volts. A first portion of the coil L4 (L4n) is coupled between the transistor $MN_{A1p}$ and the HS, and a second portion of the coil L4 (L4p) is coupled to between the transistor $MN_{A1n}$ and the HS. Thus, during operation, the differential signal (S+, S−) energizes the two coil portions (L4p and L4n).

The coil L4 is tightly coupled to the coil L1. For example, the inductive coupling between the coil L1 and L4 is set to (1.5 to 1) as indicated at 330. A more detailed description of how the coils L1 and L4 are inductively coupled is provided below.

The differential signal (S+, S−) is amplified to a high output power and inductively coupled to the coil L1. The amplified signal then flows through the DC block capacitor 312 to the diplexer 306 and is then transmitted by the antenna 310.

Assuming the second amplifier 304 is enabled, the differential signal (S+, S−) is received at the gate terminals of transistors $MN_{A2p}$ and $MN_{A2n}$, respectively. The transistors $MN_{A2p}$ and $MN_{A2n}$ are coupled to coil L5, which in turn is coupled to a low voltage power supply (LS). For example, the low voltage power supply is set to 1.2 volts. A first portion of the coil L5 (L5n) is coupled between the transistor $MN_{A2p}$ and the LS, and a second portion of the coil L5 (L5p) is coupled to between the transistor $MN_{A2n}$ and the LS. Thus, during operation, the differential signal (S+, S−) energizes the two coil portions (L5p and L5n).

The coil L5 is tightly coupled to the coil L1. For example, the inductive coupling between the coil L1 and L5 is set to (1.5 to 2) as indicated at 332. A more detailed description of how the coils L1 and L5 are inductively coupled is provided below.

The differential signal (S+, S−) is amplified to a low output power level and inductively coupled to the coil L1. The amplified signal then flows through the DC block capacitor 312 to the diplexer 306 and is then transmitted by the antenna 310.

Thus, the amplifier 300 provides amplification of the differential signal (S+, S−) at two power ranges. For low power levels, the amplifier selection circuit 308 enables the amplifier 304 and for high power levels, the amplifier selection circuit 308 enables the amplifier 302. Each amplifier comprises a coil that is inductively coupled to the coil L1 located in the output path to the diplexer 306. A details description of the various operating modes of the amplifier 300 is provided in other sections of this document.

It should also be noted that although the amplifiers 302 and 304 are differential amplifiers; the system is also compatible with single ended amplifiers. For example, the differential amplifier 302 may be replaced with the single ended amplifier 334. A similar substitution can be made for the differential amplifier 304.

Figure 4:
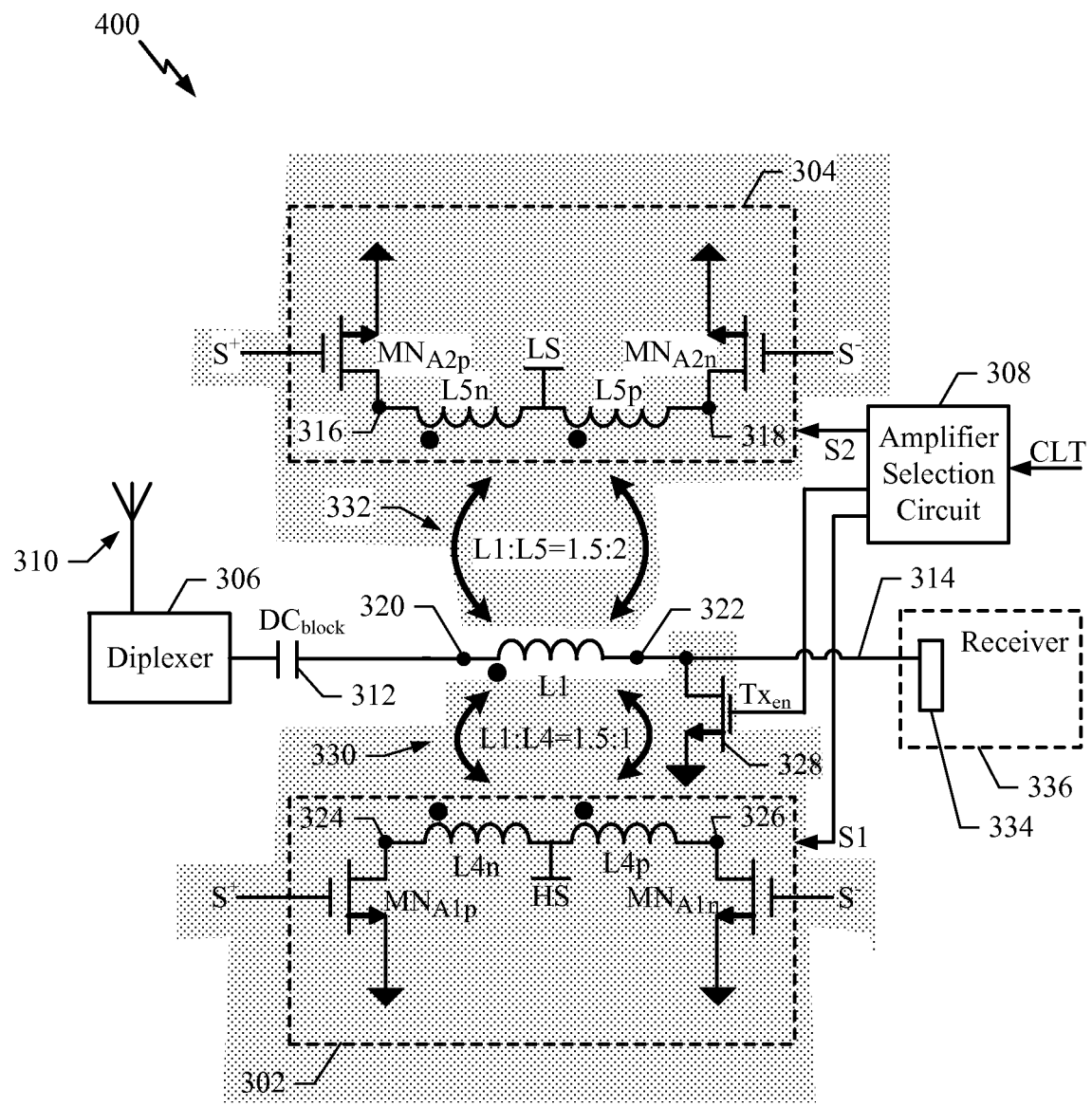
FIG. 4 shows an exemplary illustration of the amplifier of FIG. 3 operating in receive mode.

FIG. 4 shows an illustration 400 of the amplifier 300 of FIG. 3 operating in receive mode. For example, circuitry of the amplifier 300 not enabled during receive mode is shown in light gray shading.

During receive mode, the amplifier selection circuit 308 outputs the selection signals S1 and S2 to disable both amplifiers 302 and 304. Signals received at the antenna 310 are passed to the diplexer 306 which inputs them to the DC blocking capacitor 312. The signals then flow from the DC blocking capacitor 312 to the coil L1 and flow through the coil L1 on path 314 to the receiver for processing. During signal reception, the concurrent matching network operates to provide impedance matching with receiver electronics to enable the received signal to be passed to receive circuitry for further processing. For example, the inductor L1 combines with input impedance 334 of receiver 336 to provide impedance matching to facilitate reception of signals from the antenna 310.

Thus, during receive mode, the amplifiers 302 and 304 are disabled and their coupling to the coil L1 does not affect the operation of the coil L1 to combine with the receiver input impedance 334 to allow received signals to flow to the receiver 336 for processing.

Figure 5:
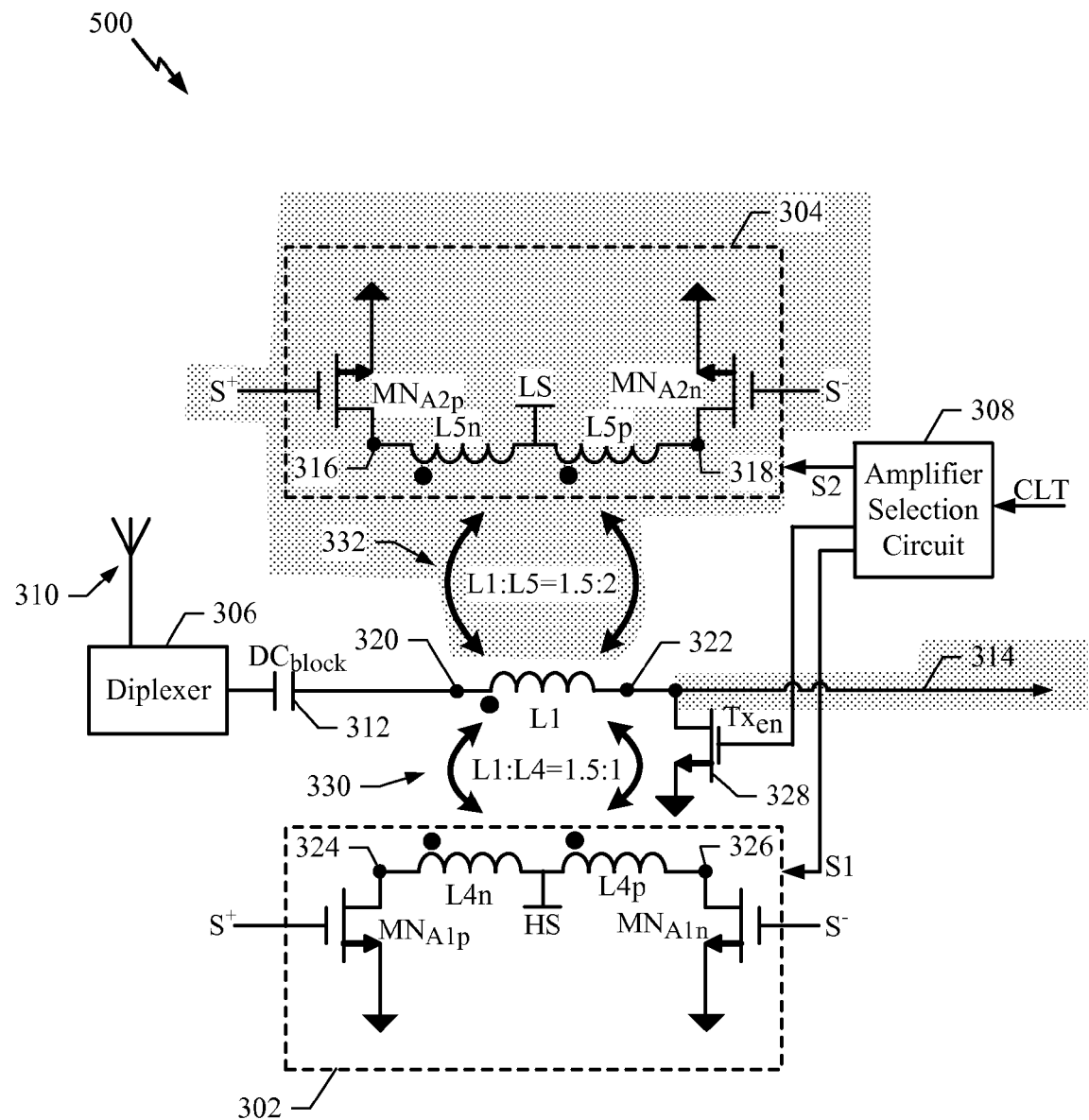
FIG. 5 shows an exemplary illustration of the amplifier of FIG. 3 operating in a high power amplification mode.

FIG. 5 shows an illustration 500 of the amplifier 300 of FIG. 3 operating in high power amplification mode. For example, circuitry of the amplifier 300 not enabled during high power amplification mode is shown in light gray shading.

During high power amplification mode, the amplifier selection circuit 308 controls the selection signal (S1) to enable the amplifier 302 and controls the selection signal (S2) to disable the amplifier 304. Additionally, the transistor 328 is activated by the $Tx_{en}$ signal so that the terminal 322 is effectively coupled to ground thereby enabling the transmission output path and disabling the receiver path 314.

Differential signals (S+, S−) are input to the amplifier 302 and result in energizing the coil L4. The coil L4 is connected to the HS and the coil L4 is also inductively coupled to the coil L1 as indicated at 330. The high power amplified signals at coil L4 are coupled to the coil L1, which is in the output path. The amplified signals then flow through the DC blocking capacitor 312 to the diplexer 306 and thereafter transmitted by the antenna 310. Thus, during high power amplification mode, the amplifier 302 operates to amplify the differential signal (S+, S−) using the HS and couples this amplified signal to the coil L1 in the output path for transmission.

Figure 6:
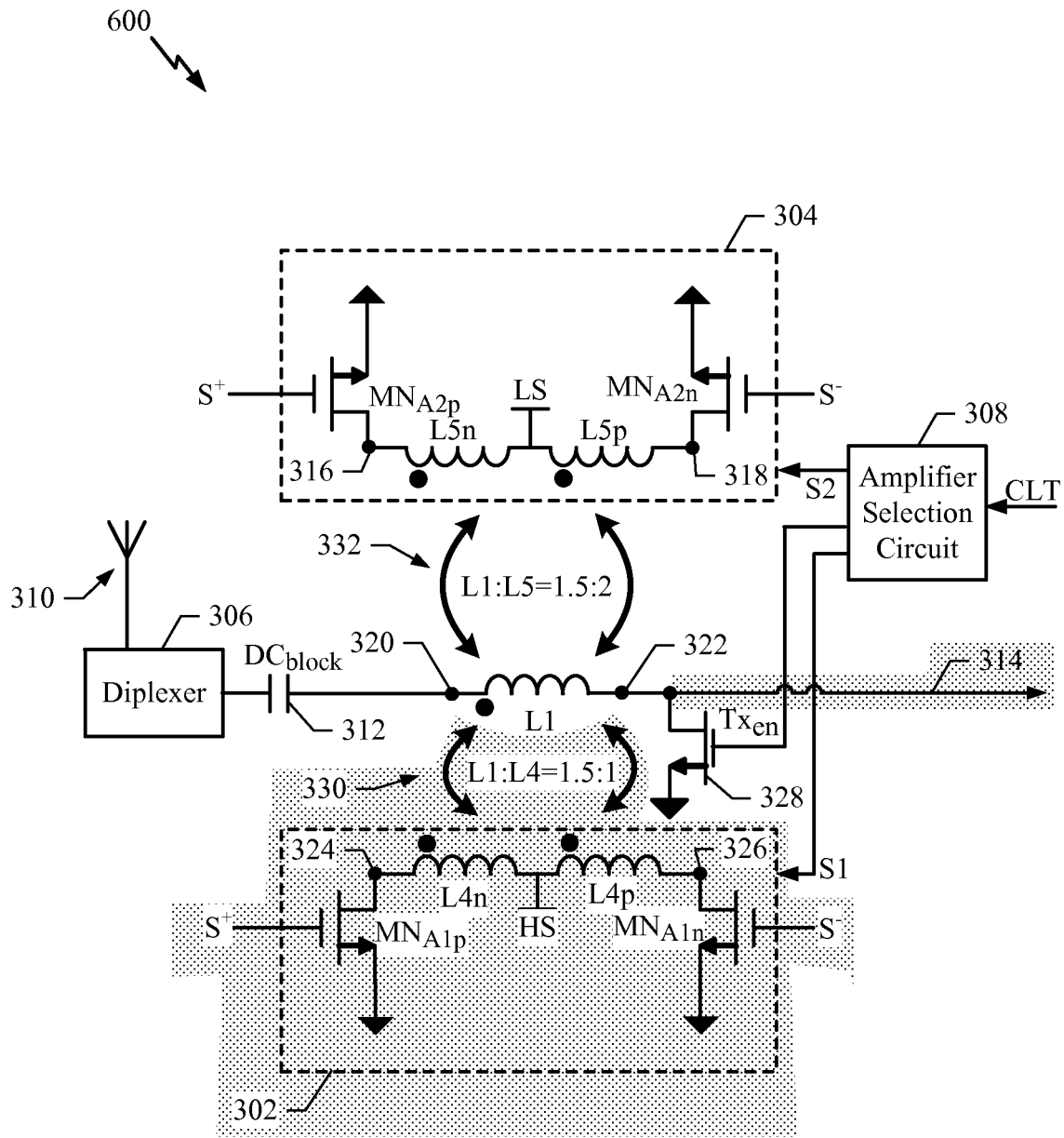
FIG. 6 shows an exemplary illustration of the amplifier of FIG. 3 operating in a low power amplification mode.

FIG. 6 shows an illustration 600 of the amplifier 300 of FIG. 3 operating in a low power amplification mode. For example, circuitry of the amplifier 300 not enabled during low power amplification mode is shown in light gray shading.

During low power amplification mode, the amplifier selection circuit 308 controls the selection signal (S1) to disable the amplifier 302 and controls the selection signal (S2) to enable the amplifier 304. Additionally, the transistor 328 is activated by the $Tx_{en}$ signal so that the terminal 322 is effectively coupled to ground thereby enabling the transmission path and disabling the receiver path 314.

Differential signals (S+, S−) are input to the amplifier 304 and result in energizing the coil L5. The coil L5 is connected to the LS and the coil L5 is inductively coupled to the coil L1 as indicated at 332. The low power amplified signals are coupled from the coil L5 to the coil L1, which is in the output path. The amplified signals then flow through the DC blocking capacitor 312 to the diplexer 306 and thereafter transmitted by the antenna 310. Thus, during low power amplification mode, the amplifier 304 operates to amplify the differential signal (S+, S−) using the LS and couples this amplified signal to the coil L1 in the output path for transmission.

Figure 7:
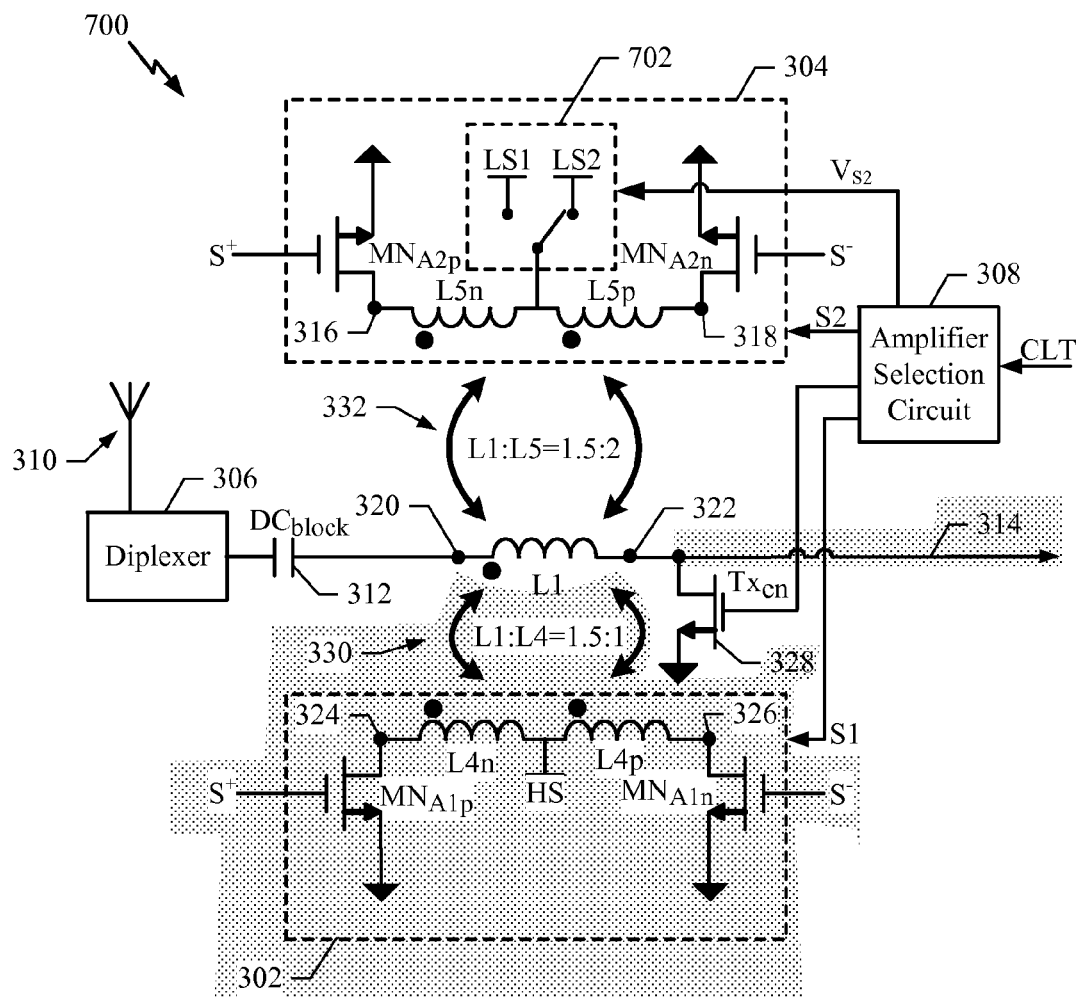
FIG. 7 shows an additional exemplary embodiment of the amplifier of FIG. 3 that utilizes switchable power supply voltages.

FIG. 7 shows an exemplary amplifier 700 comprising the amplifier 300 of FIG. 3 and additional circuitry providing for switchable low power supply voltages. For example, amplifier 700 comprises the switch circuit 702 which operates to couple one of two low voltage levels (LS1 and LS2) to the coil L5. For example, in an exemplary implementation, LS1 is 1.2 volts and LS2 is 1.8 volts.

During low power amplification mode, the amplifier selection circuit 308 controls the selection signal (S1) to disable the amplifier 302 and controls the selection signal (S2) to enable the amplifier 304. Additionally, the transistor 328 is activated by the $Tx_{en}$ signal so that the terminal 322 is effectively coupled to ground thereby enabling the output transmission path and disabling the receiver path 314. The amplifier selection circuit 308 also outputs a voltage selection signal ($V_{S2}$) which operates to control the switch circuit 702 to couple one of the two voltages (LS1 or LS2) to the coil L5.

For example, if the voltage selection signal ($V_{S2}$) is a logic "0", LS1 is coupled to the coil L5, and if the voltage selection signal ($V_{S2}$) is a logic "1", LS2 is coupled to the coil L5. If LS1 is coupled to the coil L5, the amplifier 304 provides increased efficiency at the lowest output power levels. If LS2 is coupled to the coil L5, the amplifier 304 provides increased efficiency at intermediate output power levels.

Figure 8:
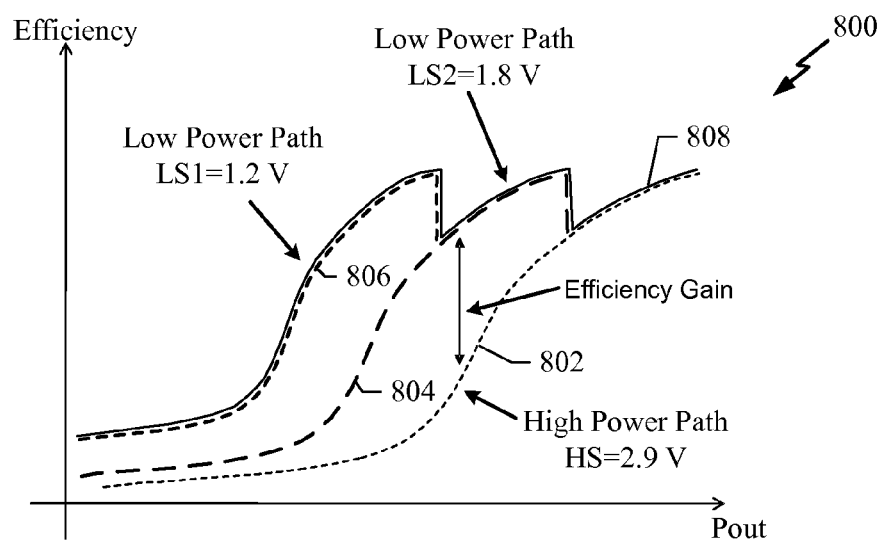
FIG. 8 shows an exemplary graph illustrating the efficiency of the amplifier of FIG. 7 at various output power levels.

FIG. 8 shows an exemplary graph 800 illustrating the efficiency of the amplifier 700 shown in FIG. 7. For example, the graph 800 illustrates the relationship between efficiency and amplifier output power during operation of the amplifier 700 shown in FIG. 7.

The curve 802 illustrates the efficiency of the amplifier 700 using the high power amplifier 302 of the high power path. The curve 804 illustrates the efficiency of the amplifier 700 using the low power amplifier 304 of the low power path with LS2 set to 1.8 volts and coupled to the coil L5. The curve 806 illustrates the efficiency of the amplifier 700 using the low power amplifier 304 of the low power path with LS1 set to 1.2 volts and coupled to the coil L5. The solid line curve 808 illustrates the resulting efficiency achieved over the entire power output range.

The graph 800 illustrates that the amplifier 700 provides greater efficiency at low power using the low power amplifier 304 as compared to the high power amplifier 302 at the same output power. An efficiency gain is illustrated as the difference in efficiency between the high power amplifier 302 at a selected output power and the low power amplifier 304 using a supply of LS2=1.8 volts at the same output power. At even lower output power values, the efficiency of the low power amplifier 304 is increased using the supply of LS1=1.2 volts as compared to us the supply of LS2=1.8 volts. Thus, the amplifier 700 provides multiple amplifier stages that are inductive coupled to an output path to allow greater efficiency to be achieved at low power levels.

Figure 9:
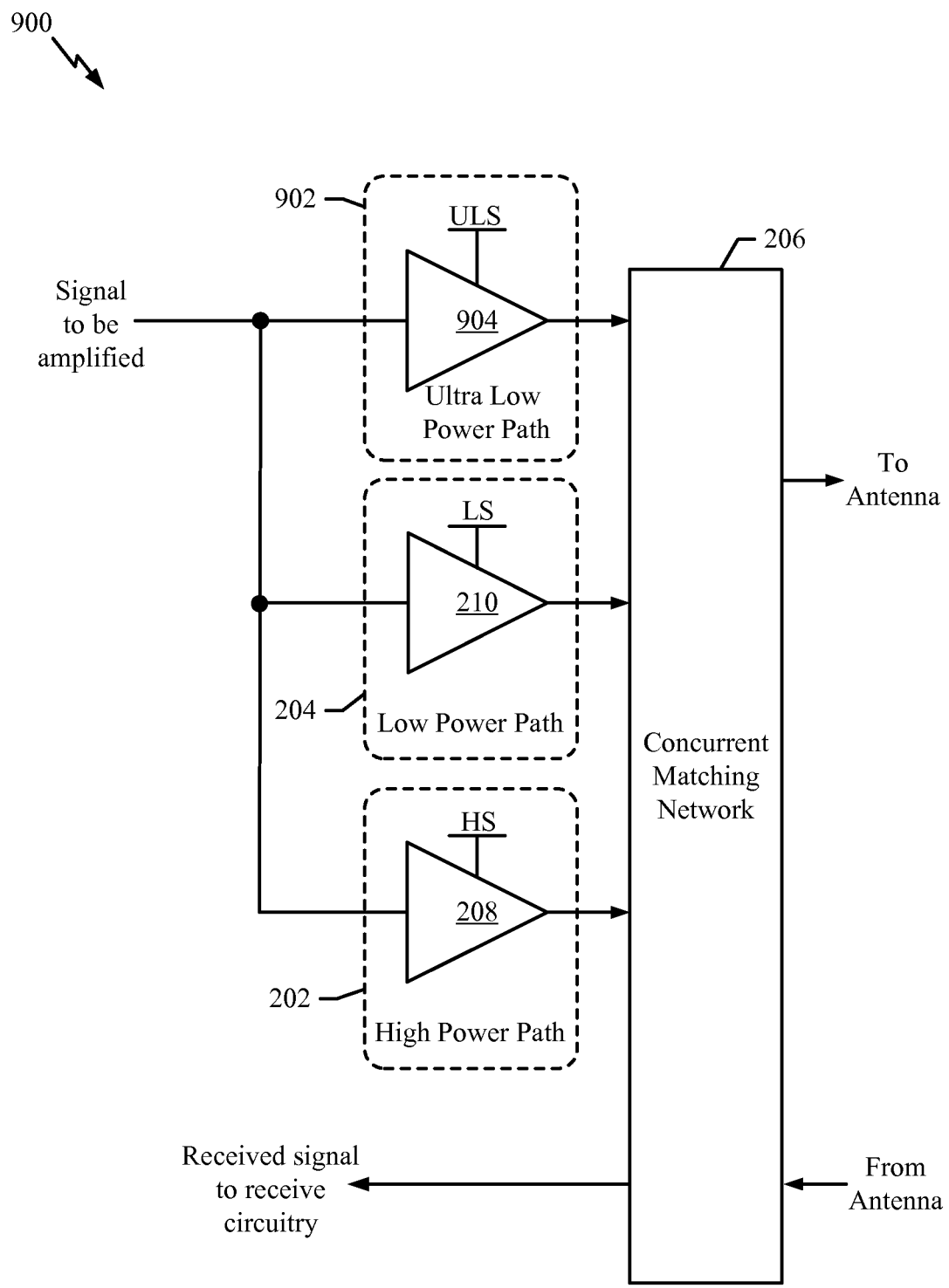
FIG. 9 shows an exemplary a system comprising the system of FIG. 2 and further comprising the addition of an ultra low power path.

FIG. 9 shows an exemplary a system 900 comprising the system 200 and further comprising the addition of an ultra low power path 902. The system 900 is suitable for use in a variety of communication devices. The ultra low power path 902 illustrates how the system 200 can be expanded to include any number of power paths to achieve increased efficiency at any desired output power level.

During operation, a signal to be amplified is input to the high power amplification path 202, the low power amplification path 204, and the ultra low power amplification path 902. One of the amplification paths is enabled to produce an amplified signal that is coupled to the concurrent matching network 206. For example, the high power amplification path 202 comprises amplifier 208 that is coupled to HS to produce a high power output that is coupled to the concurrent matching network 206. The low power amplification path 204 comprises amplifier 210 that is coupled to LS to produce a low power output that is coupled to the concurrent matching network 206. The ultra low power amplification path 902 comprises amplifier 904 that is coupled to an ultra low power supply (ULS) to produce an ultra low power output that is coupled to the concurrent matching network 206.

Depending on which amplification path is enabled, the concurrent matching network 206 operates to transform the load impedance to an optimum impedance that appears at the power amplifier output. The efficiently amplified signal is then passed to an antenna for transmission.

Figure 10:
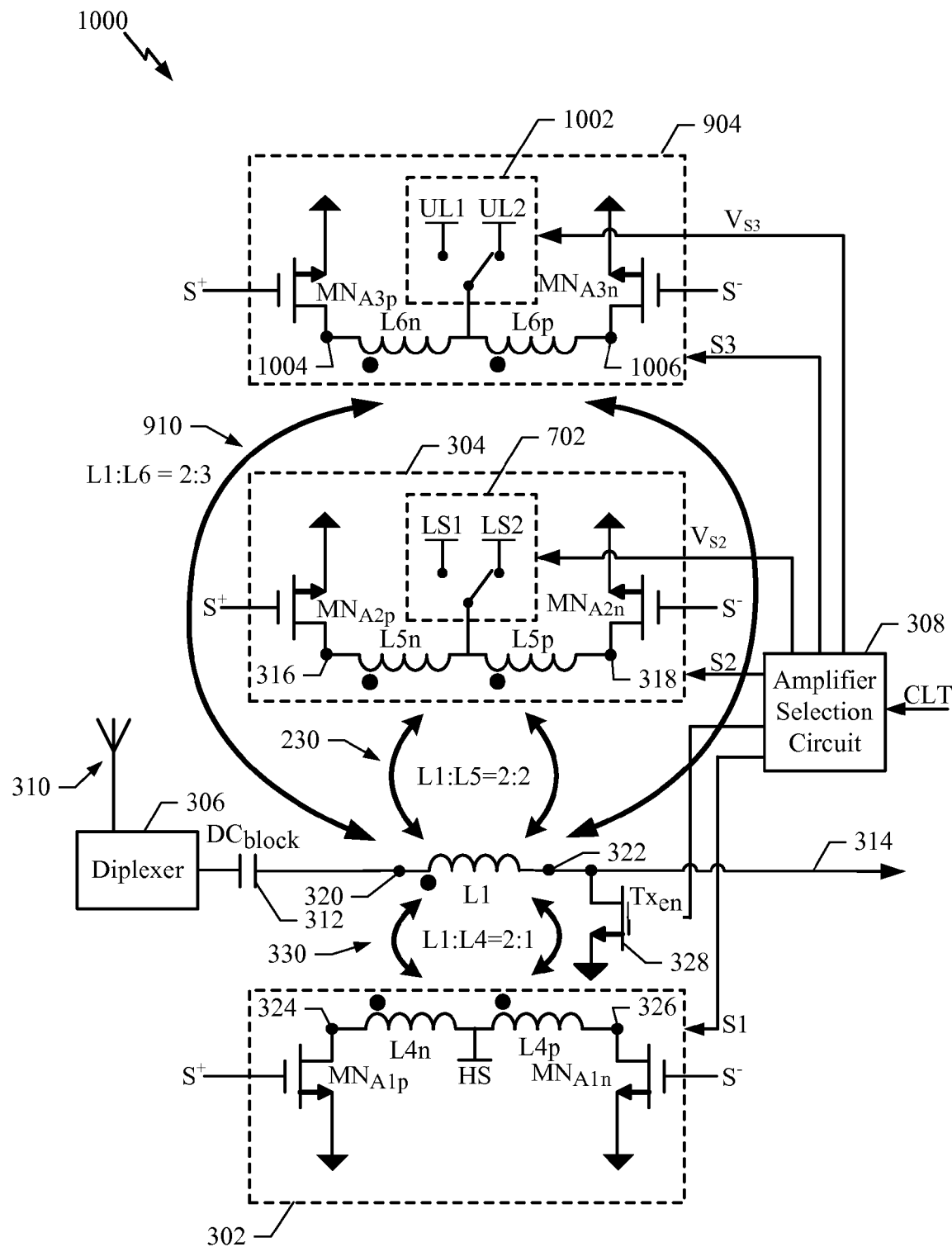
FIG. 10 shows an exemplary power amplifier providing switchable impedance transformer matching in accordance with the system shown in FIG. 9.

FIG. 10 shows an exemplary amplifier 1000 comprising the amplifier 300 of FIG. 3 and additional circuitry providing for ultra low power amplification and switchable low and ultra power supply voltages. For example, amplifier 1000 comprises an ultra low power amplifier 904 and switch circuit 1002 that operates to couple one of two low voltage levels (UL1 or UL2) to the coil L6.

During ultra low power amplification mode, the amplifier selection circuit 308 controls the selection signals (S1, S2) to disable the amplifiers 302 and 304 and controls the selection signal (S3) to enable the amplifier 902. Additionally, the transistor 328 is activated by the $Tx_{en}$ signal so that the terminal 322 is effectively coupled to ground thereby enabling the output transmission path and disabling the receiver path 314. The amplifier selection circuit 308 also outputs a voltage selection signal ($V_{S3}$) which operates to control the switch circuit 1002 to couple one of two voltages (UL1 or UL2) to the coil L6. For example, in an exemplary implementation, UL1 is 0.6 volts and UL2 is 1 volt. If UL2 is coupled to the coil L6, the amplifier 902 provides increased efficiency at the low power levels. If UL1 is coupled to the coil L6, the amplifier 902 provides increased efficiency at ultra low power levels.

Figure 11:
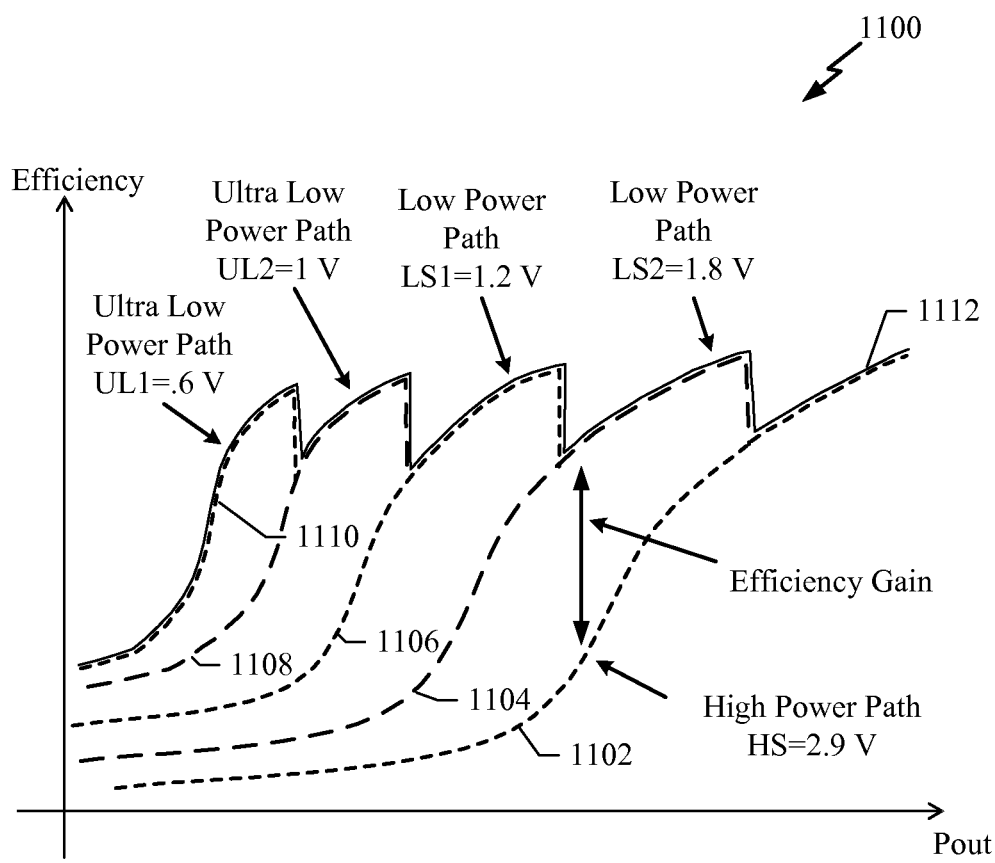
FIG. 11 shows an exemplary graph illustrating the efficiency of the amplifier of FIG. 10 at various output power levels.

FIG. 11 shows an exemplary graph 1100 illustrating the efficiency of the amplifier 1000 of FIG. 10. For example, the graph 1100 illustrates the relationship between efficiency and output power during operation of the amplifier 1000.

The curve 1102 illustrates the efficiency of the amplifier 1000 using the high power amplifier 302. The curve 1104 illustrates the efficiency of the amplifier 1000 using the low power amplifier 304 with LS2=1.8 volts coupled to the coil L5. The curve 1106 illustrates the efficiency of the amplifier 1000 using the low power amplifier 304 with LS1=1.2 volts coupled to the coil L5. The curve 1108 illustrates the efficiency of the amplifier 1000 using the ultra low power amplifier 902 with UL2=1 volt coupled to the coil L6. The curve 1110 illustrates the efficiency of the amplifier 1000 using the ultra low power amplifier 902 with UL1=0.6 volts coupled to the coil L6. The solid line curve 1112 illustrates the resulting efficiency achieved over the entire power output range.

The graph 1100 illustrates that the amplifier 1000 provides greater efficiency at low power using the ultra low power amplifier 902 as compared to the high power amplifier 302. An efficiency gain is illustrated as the difference in efficiency between the high power amplifier 302 at a selected output power and the low power amplifier 304 using LS2=1.8 volts at the same output power. At even lower output power values, the efficiency of the low power amplifier 304 is increased using the supply of 1.2 volts as compared to using the supply of 1.8 volts. At the lowest output power values, the efficiency of the ultra low power amplifier 902 is increased using the UL1=0.6 volts as compared to using the UL1=1 volt. Thus, the amplifier 1000 allows multiple amplifier stages to be inductive coupled to an output path to allow greater efficiency to be achieved at low output power levels.

Figure 12:
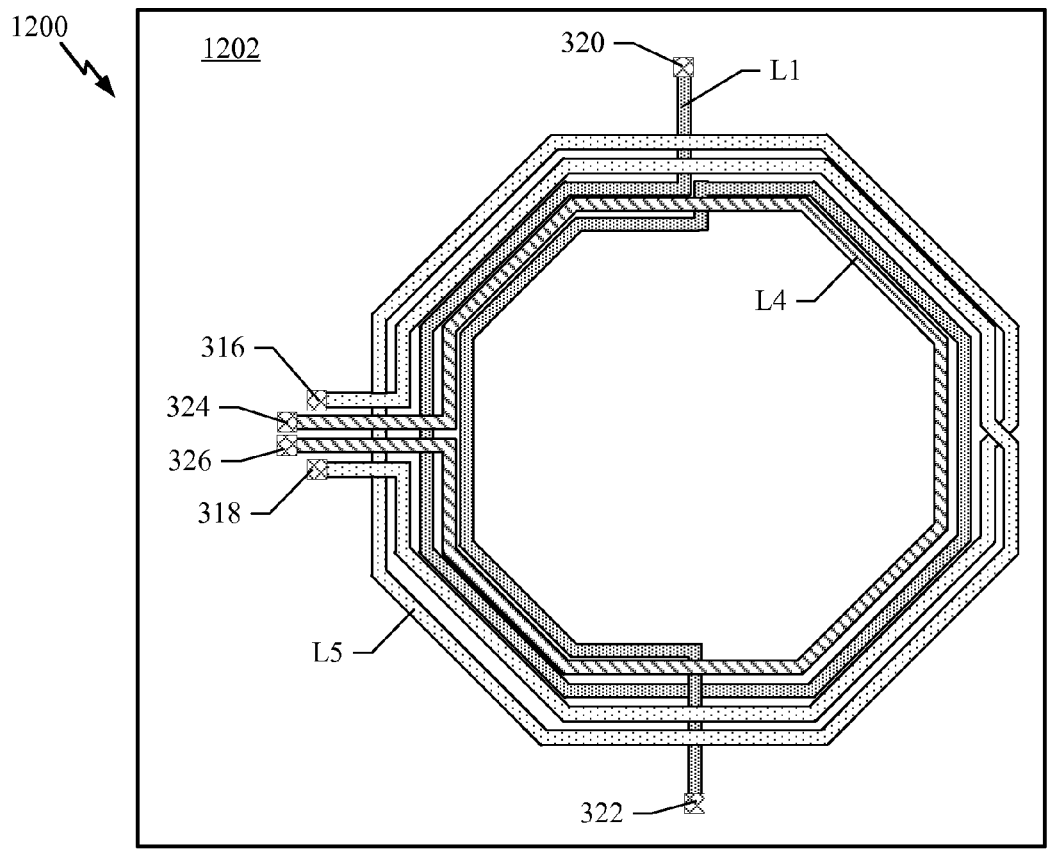
FIG. 12 shows an exemplary implementation of a transformer for use in the amplifier of FIG. 3.

FIG. 12 shows an exemplary implementation of a transformer 1200 providing switchable impedance transformer matching. For example, the transformer 1200 is suitable for use in the amplifier 300 of FIG. 3. The transformer 1200 is implemented with conductive traces on a circuit board 1202 or as part of an integrated circuit.

The transformer 1200 comprises inductor L1 having terminal connections at 320 and 322. The inductor L1 comprise a conductive trace that begins at terminal 320 and makes one and one half rotations before ending at terminal 322.

Tightly coupled to the inductor L1 is inductor L4 having terminals connections at 324 and 326. The inductor L4 comprises a conductive trace that begins at terminal 324 and makes one rotation before ending at terminal 326.

Also coupled to the inductor L1 is inductor L5 having terminals connections at 316 and 318. The inductor L5 comprises a conductive trace that begins at terminal 316 and makes two rotations before ending at terminal 318.

Thus, the transformer 1200 provides for tight coupling between coils L1 and L4 at a ratio of 1.5:1, and between coils L1 and L5 at a ratio of 1.5:2.

Figure 13:
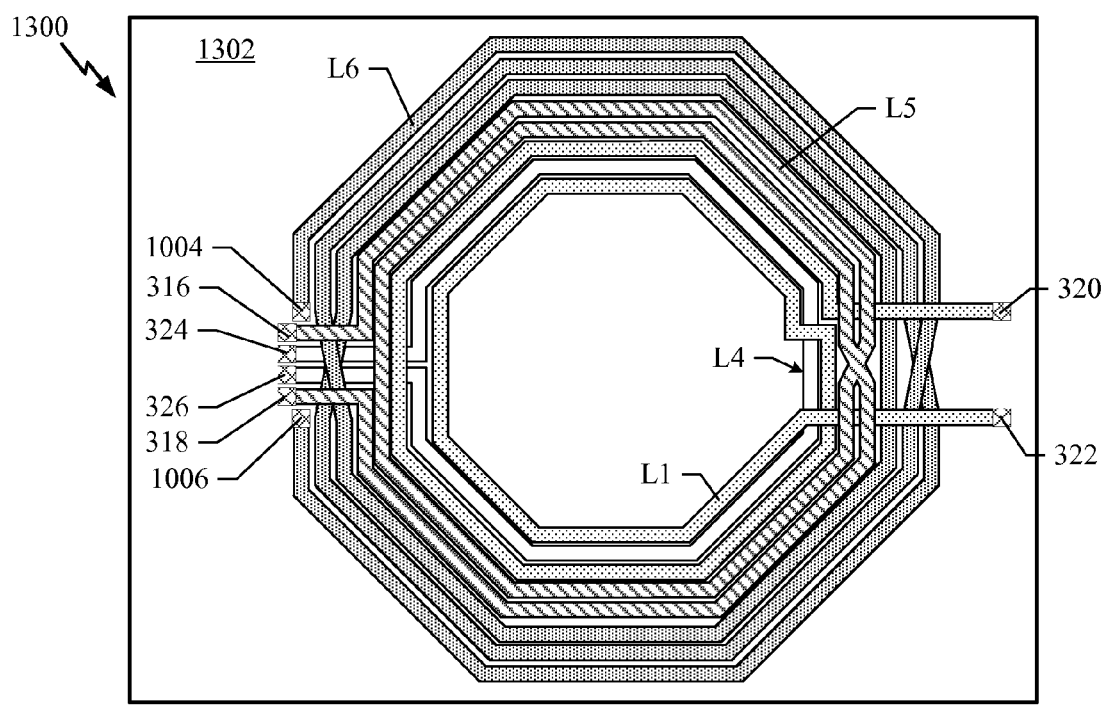
FIG. 13 shows an exemplary implementation of a transformer for use in the amplifier of FIG. 10.

FIG. 13 shows an exemplary implementation of a transformer 1300 providing switchable impedance transformer matching. For example, the transformer 1300 is suitable for use in the amplifier 1000 of FIG. 10. The transformer 1300 is implemented with conductive traces on a circuit board 1302 or as part of an integrated circuit.

The transformer 1300 comprises inductor L1 having terminal connections at 320 and 322. The inductor L1 comprise a conductive trace that begins at terminal 320 and makes two rotations (or turns) before ending at terminal 322.

Tightly coupled to the inductor L1 is inductor L4 having terminals connections at 324 and 326. The inductor L4 comprises a conductive trace that begins at terminal 324 and makes one rotation before ending at terminal 326.

Also coupled to the inductor L1 is inductor L5 having terminals connections at 316 and 318. The inductor L5 comprises a conductive trace that begins at terminal 216 and makes two rotations before ending at terminal 218.

Also coupled to the inductor L1 is inductor L6 having terminals connections at 1004 and 1006. The inductor L6 comprises a conductive trace that begins at terminal 1004 and makes three rotations before ending at terminal 1006.

Thus, the transformer 1300 provides for tight coupling between coils L1 and L4, for example at a ratio of 2:1, between coils L1 and L5, for example at a ratio of 2:2, and between coils L1 and L6 for example, at a ratio of 2:3. It should be noted that the coupling ratios provided herein are exemplary and that any desirable coupling ratios can be utilized.

Figure 14:
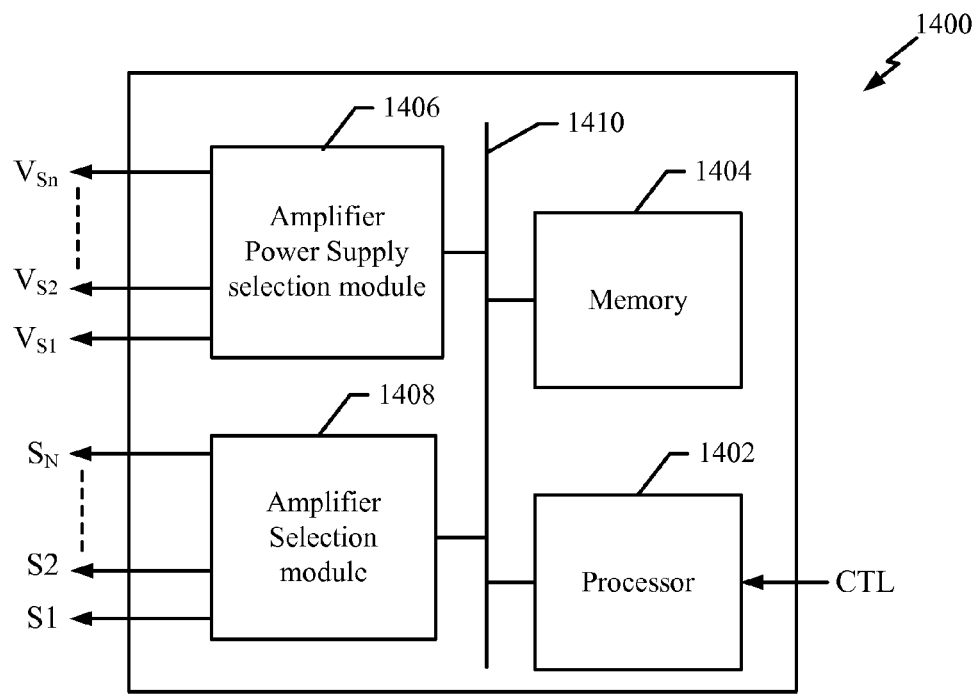
FIG. 14 shows an exemplary amplifier selection circuit.

FIG. 14 shows an exemplary amplifier selection circuit 1400. For example, the amplifier selection circuit 1400 is suitable for use as the amplifier selection circuit 308. The amplifier selection circuit 1400 comprises processor 1402, memory 1404, amplifier power supply selection module 1406 and amplifier selection module 1408 all coupled to communicate over communication bus 1410.

The processor 1402 comprises at least one of a CPU, processor, gate array, hardware logic, memory elements, and/or hardware executing software. The processor 1402 operates to control the functions of the amplifier selection circuit 1400 based on a received control signal (CTL). For example, the control signal may be receive from a control entity at a portable device. The control signal indicates an amplifier selection and a power supply selection as to be used for amplifying a data signal as discussed below.

The memory 1404 comprises RAM, ROM, EEPROM or any other type of memory device that operates to allow information to be stored and retrieved. The memory 1404 is operable to store information such as amplifier selection parameters or power supply selection parameters. The memory 1404 is also configured to store programs or instructions executable by the processor 1402 to provide the functions described herein.

The amplifier selection module 1408 comprises hardware and/or hardware executing software that operates to allow selection of a particular amplifier stage. For example, the amplifier selection module 1408 receives instructions from the processor 1402 and outputs one of the amplifier selection signals (S1-Sn) to enable a particular amplifier stage and disable one or more other amplifier stages.

The amplifier power supply selection module 1406 comprises hardware and/or hardware executing software that operates to allow selection of a particular amplifier power supply. For example, the amplifier power supply selection module 1406 receives instructions from the processor 1402 and outputs one of the amplifier power supply selection signals ($V_{S1}$-$V_{Sn}$) to enable a particular amplifier stage to use a particular power supply.

Thus, the amplifier selection circuit 1400 is operable to output selection signals to select an amplification stage and a power supply to be used by the selected amplifier stage to amplifier a data signal. It should be noted that modifications, changes, or other implementations of the amplifier selection circuit 1400 are possible within the scope of the embodiments.

Figure 15:
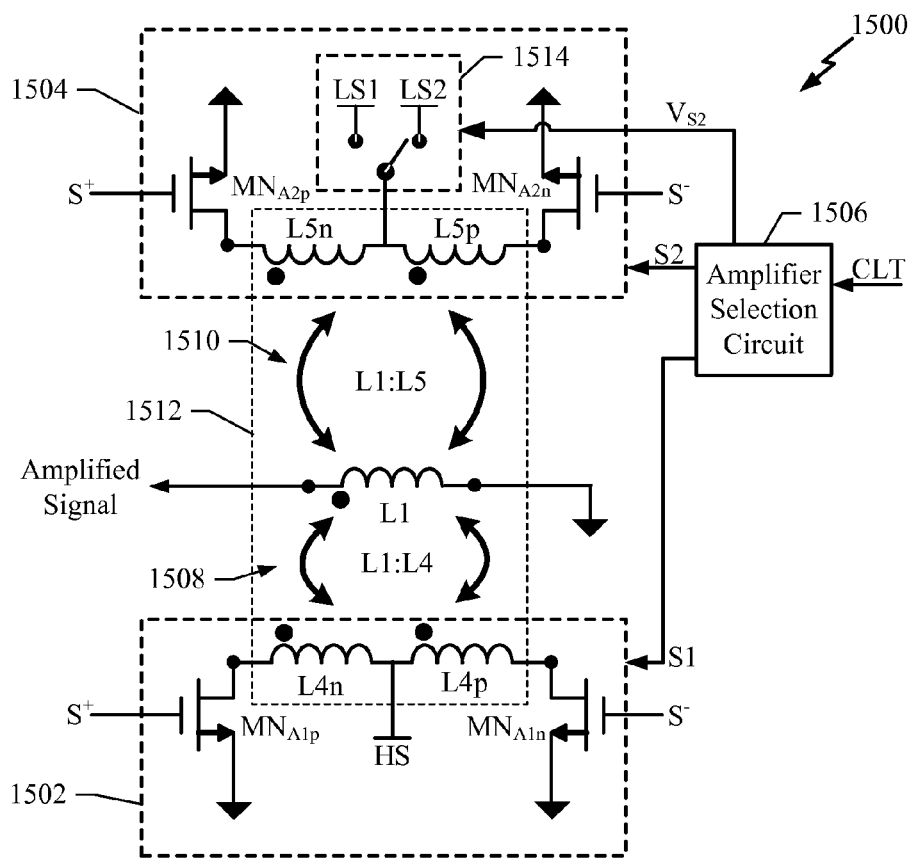
FIG. 15 shows an exemplary amplifier providing switchable impedance transformer matching.

FIG. 15 shows an exemplary amplifier 1500 providing switchable impedance transformer matching. The amplifier 1500 comprises a first amplifier 1502, a second amplifier 1504, a matching network 1512, and an amplifier selection circuit 1506. For example, the first amplifier 1502 is part of a high power amplification path and the second amplifier 1504 is part of a low power amplification path.

During operation, the amplifier selection circuit 1506 determines which of the first 1502 and second 1504 amplifiers will be used to amplify a signal. For example, the amplifier selection circuit 1506 outputs a first selection signal (S1) to enable the first amplifier 1502, and outputs a second selection signal (S2) to enable the second amplifier 1504.

Assuming the first amplifier 1502 is enabled, a differential signal (S+, S−) is received at the gate terminals of transistors $MN_{A1p}$ and $MN_{A1n}$, respectively. The transistors $MN_{A1p}$ and $MN_{A1n}$ are coupled to coil L4, which in turn is coupled to a high voltage power supply (HS). For example, in an exemplary implementation, the high voltage power supply is set to 2.9 volts. A first portion of the coil L4 (L4n) is coupled between the transistor $MN_{A1p}$ and the HS, and a second portion of the coil L4 (L4p) is coupled to between the transistor $MN_{A1n}$ and the HS. Thus, during operation, the differential signal (S+, S−) energizes the two coil portions (L4p and L4n).

The coil L4 is tightly coupled to the coil L1. For example, the inductive coupling between the coil L1 and L4 is set to provide an optimum impedance that appears at the first amplifier 1502 output. As a result, the differential signal (S+, S−) is amplified to a high output power and inductively coupled to the coil L1 in the amplifier output path.

Assuming the second amplifier 1504 is enabled, the amplifier selection circuit 1506 controls the selection signal (S1) to disable the amplifier 1502 and controls the selection signal (S2) to enable the amplifier 1504. The amplifier selection circuit 1506 also outputs a voltage selection signal ($V_{S2}$) which operates to control the switch circuit 1514 to couple one of the two voltages (LS1 or LS2) to the coil L5. For example, if the voltage selection signal ($V_{S2}$) is a logic "0", LS1 is coupled to the coil L5, and if the voltage selection signal ($V_{S2}$) is a logic "1", LS2 is coupled to the coil L5. If LS1 is coupled to the coil L5, the amplifier 1504 provides increased efficiency at the lowest power levels. If LS2 is coupled to the coil L5, the amplifier 1504 provides increased efficiency at intermediate power levels.

The coil L5 is tightly coupled to the coil L1. For example, the inductive coupling between the coil L1 and L5 is set to provide an optimum impedance that appears at the second amplifier 1504 output. The differential signal (S+, S−) is amplified to a low output power level and inductively coupled to the coil L1 in the amplifier output path.

Thus, the amplifier 1500 provides amplification of the differential signal (S+, S−) at two power ranges. For low power levels, the amplifier selection circuit 1506 enables the amplifier 1504 and for high power levels, the amplifier selection circuit 1506 enables the amplifier 1502. Each amplifier comprises a coil that is inductively coupled to the coil L1 to provide an optimum impedance that appears at the amplifier output. As a result, efficient signal amplification at multiple output power ranges is achieved.

Figure 16:
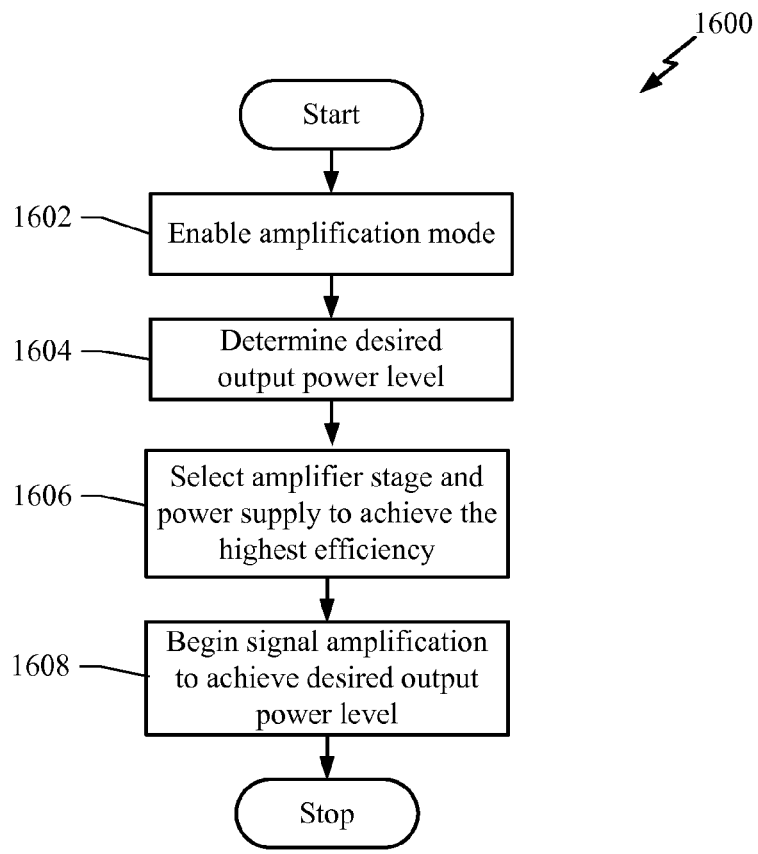
FIG. 16 shows an exemplary method for providing switchable impedance transformer matching for power amplifiers.

FIG. 16 shows an exemplary method 1600 for providing efficient amplification of a data signal at a range of output powers. For example, the method 1600 can be implemented by the amplifier 1000 shown in FIG. 10. In various implementations, the functions of the method 1600 can be performed by the processor 1402 executing instructions stored in the memory 1404.

At block 1602, an amplification mode is enabled. For example, in one implementation, the processor receives the control (CTL) signal from a controller at a device indicating that signal amplification for an output transmission is required. In response to the CTL signal, the processor 1402 outputs the $Tx_{en}$ signal to enable the output path that includes the inductor L1.

At block 1604, a desired output power level is determined. In one implementation, the processor 1302 determines the desired output power level from the received CTL signal.

At block 1606, an amplifier stage and power supply is selected based on the desired output power level to achieve the highest efficiency. For example, the processor 1302 controls the amplifier selection module 1308 to activate a particular selection signal ($S_X$) and deactivate other selection signals so that a particular amplifier stage is selected to perform amplification of the data signal to achieve the desired output power. The processor 1302 also controls the amplifier power supply selection module 1306 to activate a particular power supply selection signal ($V_{SX}$) to select a particular power supply for use with the selected amplifier stage to achieve the highest level of efficiency. For example, if the selected amplifier stage is the ultra low power amplifier stage 902 of the amplifier 900, the power supply selection signal $V_{S3}$ is set to select either the power supply UL1 or the power supply UL2 to couple to the coil L6 to achieve the highest efficiency level.

At block 1608, signal amplification to achieve the desired output power begins. For example, the data signal is presented to the selected amplifier stage, in either differential or single-ended form. The selected amplifier stage amplifies the data signal and couples the amplified signal to the inductor L1 in the output path. The selection of the amplifier stage also selects the transformer impedance matching characteristics associated with the coupling of the output coil associated with the selected amplifier stage and the coil L1 in the output path. For example, the ultra low power amplifier 902 comprises the output coil L6 that is coupled to the coil L1 so that L1:L6=2:3.

Thus, the method 1600 operates to provide for efficient amplification of a data signal at a range of output powers. It should be noted that the method 1600 is just one implementation and that the operations of the method 1600 may be rearranged or otherwise modified such that other implementations are possible.

Figure 17:
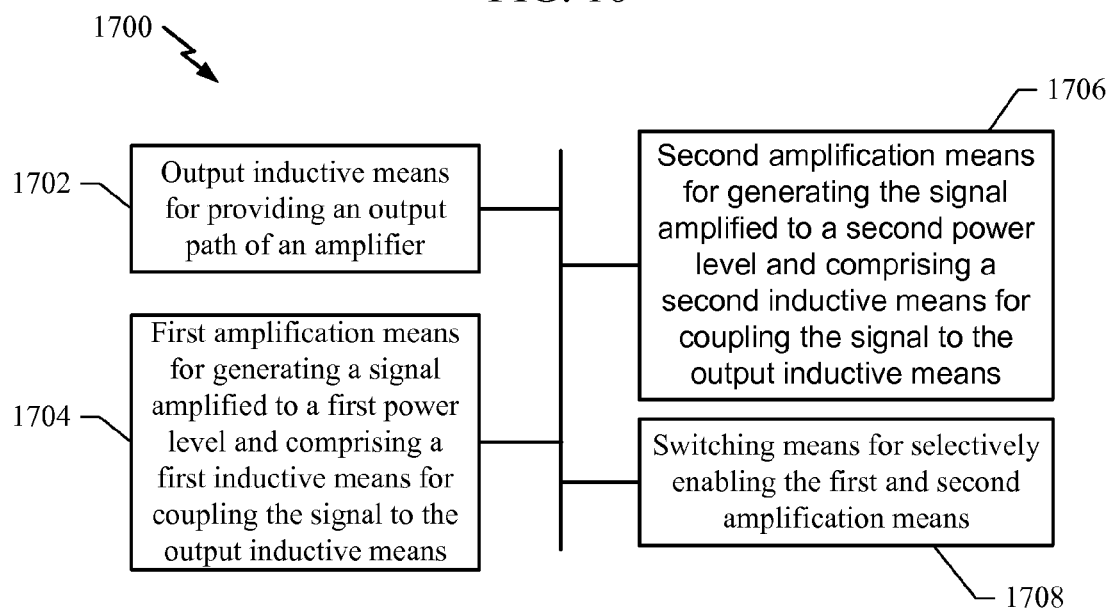
FIG. 17 shows an exemplary amplifier apparatus providing switchable impedance matching.

FIG. 17 shows an exemplary amplification apparatus 1700 that operates to provide switchable impedance matching to efficiently amplify a data signal at a range of output power levels. The apparatus 1700 is suitable for use as the amplifier 200 shown in FIG. 2 or the amplifier 900 shown in FIG. 9. In an aspect, the apparatus 1700 is implemented by one or more modules configured to provide the functions as described herein. For example, in an aspect, each module comprises hardware and/or hardware executing software.

The amplification apparatus 1700 comprises a first module comprising output inductive means (1702) for providing an output path of the amplifier, which in an aspect comprises the inductor L1.

The apparatus 1700 also comprises a second module comprising first amplification means (1704) for generating a signal amplified to a first power level, the first amplification means comprising a first inductive means for coupling the signal to the output inductive means, which in an aspect comprises the first amplifier stage 302.

The apparatus 1700 also comprises a third module comprising second amplification means (1706) for generating the signal amplified to a second power level, the second amplification means comprising a second inductive means for coupling the signal to the output inductive means, which in an aspect comprises the second amplifier stage 304.

The apparatus 1700 also comprises a fourth module comprising switching means (1708) for selectively enabling the first and second amplification means, which in an aspect comprises amplifier selection circuit 308.

Figure 18:
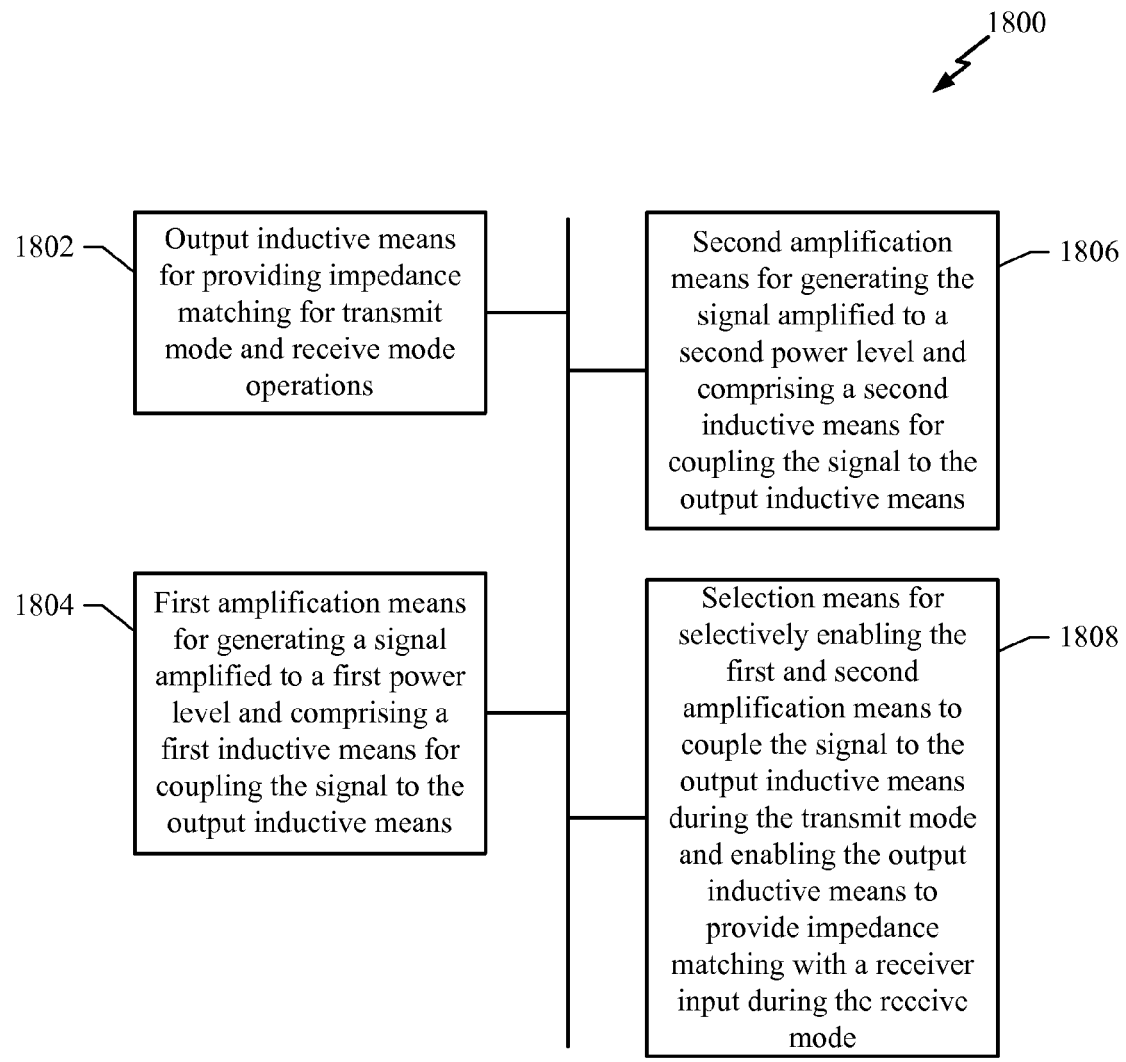
FIG. 18 shows an exemplary amplifier apparatus providing switchable concurrent impedance matching.

FIG. 18 shows an exemplary amplification apparatus 1800 that operates to provide switchable concurrent impedance matching for signal reception and efficient amplification of a data signal at a range of output power levels. The apparatus 1800 is suitable for use as the amplifier 200 shown in FIG. 2 or the amplifier 900 shown in FIG. 9. In an aspect, the apparatus 1800 is implemented by one or more modules configured to provide the functions as described herein. For example, in an aspect, each module comprises hardware and/or hardware executing software.

The amplification apparatus 1800 comprises a first module comprising an output inductive means (1802) for providing impedance matching for transmit mode and receive mode operations, which in an aspect comprises the inductor L1.

The apparatus 1800 also comprises a second module comprising first amplification means (1804) for generating a signal amplified to a first power level, the first amplification means comprising a first inductive means for coupling the signal to the output inductive means, which in an aspect comprises the first amplifier stage 302.

The apparatus 1800 also comprises a third module comprising second amplification means (1806) for generating the signal amplified to a second power level, the second amplification means comprising a second inductive means for coupling the signal to the output inductive means, which in an aspect comprises the second amplifier stage 304.

The apparatus 1800 also comprises a fourth module comprising selection means (1808) for selectively enabling the first and second amplification means to couple the signal to the output inductive means during the transmit mode and enabling the output inductive means to provide impedance matching with a receiver input during the receive mode, which in an aspect comprises amplifier selection circuit 308.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An amplifier providing switchable impedance matching, comprising:
    an output inductor that is part of an output path of the amplifier;
    a first amplifier stage comprising a first inductor coupled to a first power supply, the first inductor configured to inductively couple a signal amplified by the first amplifier stage at a first power level to the output inductor in response to a first enable signal; and
    a second amplifier stage comprising a second inductor selectively alternatively coupled to either a second or third, different power supply, the second inductor configured to inductively couple the signal amplified by the second amplifier stage at either a second or third power level to the output inductor in response to a second enable signal, the first and second amplifier stages being alternatively enabled.

2. The amplifier of claim 1, the amplifier comprising a power amplifier.

3. The amplifier of claim 1, the first and second enable signals are configured to enable either the first amplifier stage or the second amplifier stage at any particular time.

4. The amplifier of claim 1, the first power level is higher than the second power level.

5. The amplifier of claim 1, the second amplifier stage operates at a higher efficiency at the second power level than the first amplifier stage.

6. The amplifier of claim 1, the output inductor and the first inductor are inductively coupled to provide optimum impedance at the first power level.

7. The amplifier of claim 1, the output inductor and the second inductor are inductively coupled to provide optimum impedance at the second power level.

8. The amplifier of claim 1, further comprising one or more additional amplifier stages, each additional amplifier stage comprising an additional inductor coupled to the output inductor, the additional inductor configured to couple a signal amplified by the additional amplifier stage at an additional power level to the output inductor in response to an additional enable signal.

9. The amplifier of claim 1, wherein a second power supply voltage of the second power supply is lower in voltage than a first power supply voltage of the first power supply.

10. An amplifier providing switchable impedance matching, comprising:
output inductive means for providing an output path of the amplifier;
first amplification means for generating a signal amplified to a first power level, the first amplification means comprising a first inductive means coupled to a first power supply and for inductively coupling the signal to the output inductive means;
second amplification means for generating the signal amplified to either a second power level or a third power level, the second amplification means comprising a second inductive means selectively alternatively coupled to either a second or third, different power supply and for inductively coupling the signal to the output inductive means; and
switching means for selectively alternatively enabling the first and second amplification means.

11. The amplifier of claim 10, the amplifier comprising a power amplifier.

12. The amplifier of claim 10, the switching means for enabling either the first amplification means or the second amplification means at any particular time.

13. The amplifier of claim 10, the first power level is higher than the second power level.

14. The amplifier of claim 10, the second amplification means operates at a higher efficiency at the second power level than the first amplification means.

15. The amplifier of claim 10, the output inductive means and the first inductive means are inductively coupled to provide optimum impedance at the first power level.

16. The amplifier of claim 10, the output inductive means and the second inductive means are inductively coupled to provide optimum impedance at the second power level.

17. The amplifier of claim 10, further comprising one or more additional amplification means for generating the signal amplified to one or more additional power levels, respectively, the one or more additional amplification means comprising one or more inductive means, respectively, for coupling the signal to the output inductive means.

18. The amplifier of claim 10, wherein a second power supply voltage of the second power supply is lower in voltage than a first power supply voltage of the first power supply.

19. An amplifier apparatus providing switchable concurrent impedance matching, comprising:
an output inductor configured to provide impedance matching for transmit mode and receive mode operations;
first amplification stage for generating a signal amplified to a first power level, the first amplification stage comprising a first inductor coupled to a first power supply and for inductively coupling the signal to the output inductor;
second amplification stage for generating the signal amplified to either a second power level or a third power level, the second amplification stage comprising a second inductor selectively alternatively coupled to either a second or third, different power supply and for inductively coupling the signal to the output inductor; and
a selection circuit for selectively alternatively enabling the first and second amplification stages to couple the signal to the output inductor during the transmit mode and enabling the output inductor to provide impedance matching with a receiver input during the receive mode.

20. The amplifier apparatus of claim 19, the amplifier apparatus comprising a power amplifier.

21. The amplifier apparatus of claim 19, the selection circuit operable during the transmit mode to disable the output inductor from providing impedance matching with the receiver input and to enable either the first amplification stage or the second amplification stage to couple the signal to the output inductor.

22. The amplifier apparatus of claim 19, the selection circuit operable during the receive mode to enable the output inductor to provide impedance matching with the receiver input and to disable both the first amplification stage and the second amplification stage from coupling the signal to the output inductor.

23. The amplifier apparatus of claim 19, the first power level is higher than the second power level.

24. The amplifier apparatus of claim 19, the second amplification stage operates at a higher efficiency at the second power level than the first amplification stage.

25. The amplifier apparatus of claim 19, the output inductor and the first inductor are inductively coupled to provide optimum impedance at the first power level during the transmit mode.

26. The amplifier apparatus of claim 19, the output inductor and the second inductor are inductively coupled to provide optimum impedance at the second power level during the transmit mode.

27. The amplifier apparatus of claim 19, further comprising one or more additional amplification stages, each additional amplification stage comprising an additional inductor coupled to the output inductor, the additional inductor configured to couple a signal amplified by the additional amplification stage at an additional power level to the output inductor in response to an additional enable signal provided by the selection circuit during the transmit mode.

28. The amplifier apparatus of claim 19, wherein a second power supply voltage of the second power supply is lower in voltage than a first power supply voltage of the first power supply.

29. An amplifier apparatus providing switchable concurrent impedance matching, comprising:
an output inductive means for providing impedance matching for transmit mode and receive mode operations;
first amplification means for generating a signal amplified to a first power level, the first amplification means comprising a first inductive means coupled to a first power supply and for inductively coupling the signal to the output inductive means;
second amplification means for generating the signal amplified to either a second power level or a third power level, the second amplification means comprising a second inductive means selectively alternatively coupled to either a second or third, different power supply and for inductively coupling the signal to the output inductive means; and
a selection means for selectively alternatively enabling the first and second amplification means to couple the signal to the output inductive means during the transmit mode and enabling the output inductive means to provide impedance matching with a receiver input during the receive mode.

30. The amplifier apparatus of claim 29, the amplifier apparatus comprising a power amplifier.

31. The amplifier apparatus of claim 29, the selection means for disabling the output inductive means from providing impedance matching with the receiver input and enabling either the first amplification means or the second amplification means to couple the signal to the output inductive means during the transmit mode.

32. The amplifier apparatus of claim 29, the selection circuit for enabling the output inductive means to provide impedance matching with the receiver input and disabling both the first amplification means and the second amplification means from coupling the signal to the output inductive means during the receive mode.

33. The amplifier apparatus of claim 29, the first power level is higher than the second power level.

34. The amplifier apparatus of claim 29, the second amplification means operates at a higher efficiency at the second power level than the first amplification means.

35. The amplifier apparatus of claim 29, the selection means for inductively coupling the output inductive means to the first inductive means to provide optimum impedance at the first power level during the transmit mode.

36. The amplifier apparatus of claim 29, the selection means for inductively coupling the output inductive means to the second inductive means to provide optimum impedance at the second power level during the transmit mode.

37. The amplifier apparatus of claim 29, further comprising one or more additional amplification means, each additional amplification means comprising an additional inductive means coupled to the output inductive means, the additional inductive means configured to couple a signal amplified by the additional amplification means at an additional power level to the output inductive means in response to an additional enable signal provided by the selection means during the transmit mode.

38. The amplifier apparatus of claim 29, wherein a second power supply voltage of the second power supply is lower in voltage than a first power supply voltage of the first power supply.

* * * * *